US012756152B2

(12) United States Patent
Kimura et al.

(10) Patent No.: US 12,756,152 B2
(45) Date of Patent: Oct. 6, 2026

(54) LIGHT SOURCE DEVICE

(71) Applicant: NICHIA CORPORATION, Anan (JP)

(72) Inventors: Yoshihiro Kimura, Yokohama (JP); Tadaaki Miyata, Yokohama (JP)

(73) Assignee: NICHIA CORPORATION, Anan (JP)

( * ) Notice: Subject to any disclaimer, the term of this patent is extended or adjusted under 35 U.S.C. 154(b) by 520 days.

(21) Appl. No.: 18/475,196

(22) Filed: Sep. 26, 2023

(65) Prior Publication Data

US 2024/0106187 A1 Mar. 28, 2024

(30) Foreign Application Priority Data

Sep. 28, 2022 (JP) ................................ 2022-154625

(51) Int. Cl.
*H01S 5/02255* (2021.01)
*H01S 5/026* (2006.01)

(52) U.S. Cl.
CPC ........ *H01S 5/02255* (2021.01); *H01S 5/0264* (2013.01)

(58) Field of Classification Search
CPC ........................................................ H01S 5/18
See application file for complete search history.

(56) References Cited

U.S. PATENT DOCUMENTS 5,936,929 A 8/1999 Jiang et al.
6,469,785 B1 * 10/2002 Duveneck ............ G01N 21/648 422/82.11
6,587,481 B1 7/2003 Seong et al.
11,381,057 B2 * 7/2022 Miyata .................. H01S 5/0683
2012/0195336 A1 * 8/2012 Fang ........................ H01S 5/185 257/E33.072
2012/0281727 A1 * 11/2012 Fang ................... H01S 5/04253 372/44.01
2016/0111850 A1 4/2016 Muendel et al.
2018/0087726 A1 * 3/2018 Yamashita .......... H01S 5/02255
2019/0372302 A1 * 12/2019 Miyata .................... H01S 5/021
2020/0169060 A1 * 5/2020 Shih ..................... H01S 5/02253
2020/0227890 A1 * 7/2020 Chen ................... H01S 5/02461
2020/0264500 A1 * 8/2020 Kozuru .............. G03B 21/2033
2024/0128710 A1 * 4/2024 Kimura ............... H01S 5/02345
(Continued)

FOREIGN PATENT DOCUMENTS

JP H10-134388 A 5/1998
JP PH10-312577 A 11/1998
JP 2000-012957 A 1/2000
(Continued)

*Primary Examiner* — Deandra M Hughes
(74) *Attorney, Agent, or Firm* — Spencer Fane LLP

(57) ABSTRACT

A light source device includes a substrate, an edge-emitting laser element, a surface-emitting laser element, and an optical member. The substrate has a supporting surface. The edge-emitting laser element is directly or indirectly supported by the supporting surface and configured to emit a first light beam in a first direction. The surface-emitting laser element is directly or indirectly supported by the supporting surface and configured to emit a second light beam in a second direction different from the first direction. The optical member is configured to receive the first light beam and the second light beam and to cause the first light beam and the second light beam to exit the optical member as light beams traveling along a same axis.

13 Claims, 9 Drawing Sheets

(56) References Cited

U.S. PATENT DOCUMENTS

| | | | | |
|---|---|---|---|---|
| 2026/0180279 | A1* | 6/2026 | Kimura | H01S 5/02257 |

FOREIGN PATENT DOCUMENTS

| | | | | | |
|---|---|---|---|---|---|
| JP | 2000-215498 | A | | 8/2000 | |
| JP | 2002-175642 | A | | 6/2002 | |
| JP | 2007-103731 | A | | 4/2007 | |
| JP | 2008-028614 | A | | 2/2008 | |
| JP | 2016-111339 | A | | 6/2016 | |
| JP | 2017212390 | A | * | 11/2017 | |
| JP | 2020202319 | A | * | 12/2020 | |
| JP | 7152652 | B2 | * | 10/2022 | H01S 5/0235 |
| JP | 7302313 | B2 | * | 7/2023 | |
| WO | 2017/203786 | A1 | | 11/2017 | |
| WO | WO-2020194501 | A1 | * | 10/2020 | H01S 5/022 |

* cited by examiner

LIGHT SOURCE DEVICE

CROSS-REFERENCE TO RELATED APPLICATION

This application claims priority to Japanese Patent Application No. 2022-154625 filed on Sep. 28, 2022, the disclosure of which is hereby incorporated herein by reference in its entirety.

BACKGROUND

The present disclosure relates to a light source device.

An optical module including a vertical-cavity surface-emitting laser element and an edge-emitting laser element has been studied. Japanese Unexamined Patent Application Publication No. 2007-103731 discloses an optical communication module including a vertical-cavity surface-emitting laser element and an edge-emitting laser element fixed on a device mounting stage. The vertical-cavity surface-emitting laser element and the edge-emitting laser element are disposed in a single package and emit light with different wavelengths in the same direction toward a lens.

SUMMARY

Certain embodiments of the present disclosure allow for providing a convenient light source device.

A light source device includes a substrate, an edge-emitting laser element, a surface-emitting laser element, and an optical member. The substrate has a supporting surface. The edge-emitting laser element is directly or indirectly supported by the supporting surface and configured to emit a first light beam in a first direction. The surface-emitting laser element is directly or indirectly supported by the supporting surface and configured to emit a second light beam in a second direction different from the first direction. The optical member is configured to receive the first light beam and the second light beam and to cause the first light beam and the second light beam to exit the optical member as light beams traveling along a same axis.

According to certain embodiments of the present disclosure a convenient light source device can be provided.

DETAILED DESCRIPTION OF EMBODIMENTS

Figure 1:
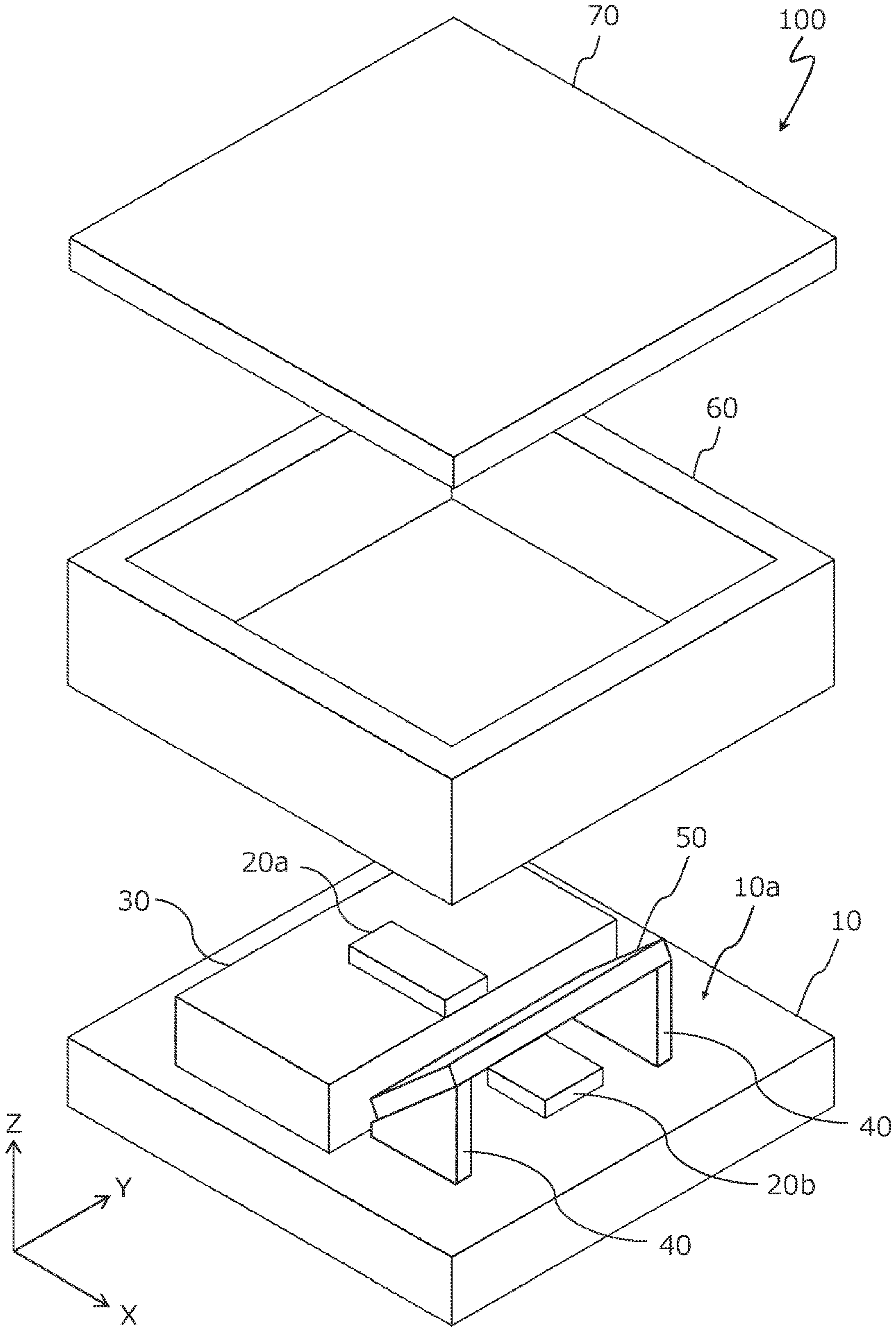
FIG. 1 is a schematic exploded perspective view of a light source device according to a first embodiment.

Certain embodiments of the present disclosure will be described below in detail with reference to the accompanying drawings. The embodiments described below are illustrative, and the light source device according to the present disclosure is not limited to the embodiments described below. For example, the numerical values, shapes, materials, steps, the sequence of the steps, and the like described in the embodiments described below are merely examples and can be modified in various ways as long as technical contradictions do not arise. The various embodiments described below are only intended to give examples and can be combined in various ways as long as technical contradictions do not arise.

The dimensions, shapes, and the like of the components shown in the drawings may be exaggerated for ease of explanation and may not represent the dimension, the shape, and the size relationship between components in an actual light source device. The illustration of the components may be partly omitted to prevent the drawings from being too complicated.

In the description below, components having substantially the same function will be shown with the same reference numerals, and repeated descriptions of such components may be omitted. Terms representing particular directions or positions (such as "up/upper," "down/lower," "right," "left," and other terms containing the meanings of these terms) may be used. These terms are used merely for the sake of ease of explanation, representing relative directions or relative positions in the reference drawings. As far as the relative directions or positions mentioned by the terms "upper," "lower," and the like designate the same directions or positions in the reference drawings, drawings other than shown in the present disclosure, actual products, and manufacturing equipment do not have to be the same arrangement as shown in the reference drawings.

In the present specification or the claims, polygonal shapes such as triangular shapes and quadrangular shapes are not limited to polygonal shapes in the mathematically strict sense and include polygonal shapes with rounded corners, beveled corners, angled corners, reverse-rounded corners. Likewise, not only polygonal shapes with such modification at corners (end of sides) but also polygonal shapes with modifications at intermediate portions of sides of the shapes are also referred to as polygonal shapes. That is, shapes based on polygonal shapes and partially modified are also included in "polygonal shapes."

In the present specification or the claims, in the case in which a plurality of elements are specified by a name and are distinguished from one another, an ordinal numeral such as "first" and "second" may be added to the beginning of the name of each element. These ordinal numerals are merely labels for distinguishing the object to which the ordinal numerals are added. The number, sequence, order, and the like of these ordinal numerals have no particular meaning. For example, in the case in which the term "first light-emitting element" is used and the term "second light-emitting element" is not used in claim 1 described in the claims, it is sufficient that the invention according to claim 1 includes one light-emitting element, and the light-emitting element is not limited to the "first light-emitting element" but can be the "second light-emitting element" in the specification.

A light source device according to certain embodiments of the present disclosure includes a substrate having a supporting surface, one or more edge-emitting laser (EEL) elements, one or more surface-emitting laser elements, and an optical member. The light source device can further include a submount. According to the product specification or the requirements specification, the light source device can include a protective element typified by a Zener diode and/or a temperature sensor, such as a thermistor, for measuring the internal temperature.

First Embodiment

Figure 2:
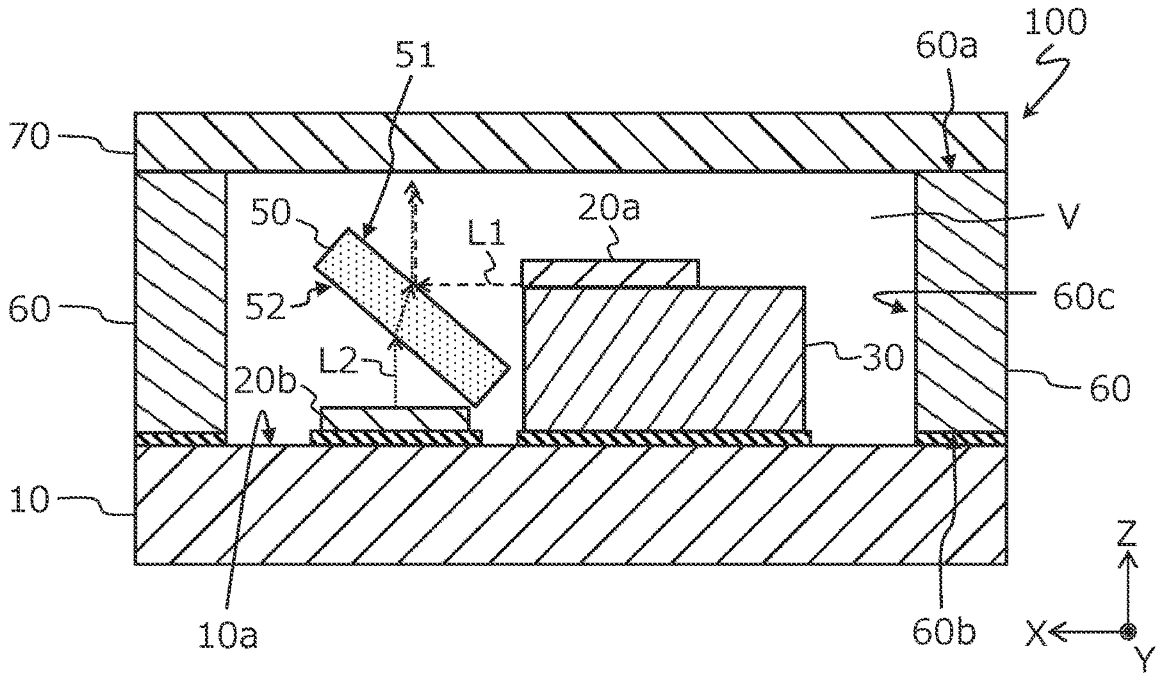
FIG. 2 is a schematic cross-sectional view of the light source device according to the first embodiment taken along a plane parallel to the XZ-plane.

An example of a light source device according to a first embodiment of the present disclosure will be described with reference to FIG. 1 and FIG. 2. The drawings show an X-axis, a Y-axis, and a Z-axis orthogonal to one another. FIG. 1 is a schematic exploded perspective view of a light source device 100 according to the first embodiment. FIG. 2 is a schematic cross-sectional view of the light source device 100 according to the first embodiment taken along a plane parallel to the XZ-plane.

Hereinafter the directions of the X-axis, the Y-axis, and the Z-axis are respectively referred to as an X direction, a Y direction, and a Z direction. The X direction is parallel to a supporting surface 10*a* of a substrate 10. The Z direction is parallel to a direction (normal direction) perpendicular to the supporting surface 10*a*. The supporting surface 10*a* shown in FIG. 1 or FIG. 2 extends along the XY-plane. The term "top view" used in the following description refers to a top plan view taken in the direction perpendicular to the supporting surface 10*a* of the substrate 10, that is, in the Z direction.

The light source device 100 illustrated in FIG. 1 includes an edge-emitting laser element 20*a*, a surface-emitting laser element 20*b*, and an optical member 50. As described below, the edge-emitting laser element 20*a*, the surface-emitting laser element 20*b*, and the optical member 50 can be disposed in a sealed space defined by the substrate 10, a lateral wall 60, and a cover portion 70.

The edge-emitting laser element 20*a* emits a first light beam L1 in a first direction. In FIG. 2, the optical axis of the first light beam L1 is indicated by a broken arrow. In embodiments of the present disclosure to be described below, the first direction is parallel to the X direction unless otherwise specified. The first direction is not required to be strictly parallel to the X direction, and this "parallel" can include a difference of ±5°.

The surface-emitting laser element 20*b* emits a second light beam L2 in a second direction different from the first direction. In FIG. 2, the optical axis of the second light beam L2 is indicated by a dotted arrow. In embodiments of the present disclosure, the second direction is parallel to the Z direction unless otherwise specified. The second direction is not required to be strictly parallel to the Z direction, and the term "parallel" can include a deviation of ±5°.

The optical axis of the light beam is the center of the beam and refers to a light ray passing through the center of a beam section. FIG. 2 shows one light beam L1 emitted from the edge-emitting laser element 20*a* and one light beam L2 emitted from the surface-emitting laser element 20*b*. As described below, the edge-emitting laser element 20*a* and/or the surface-emitting laser element 20*b* can be multi-emitter laser diodes. In this case, the multi-emitter laser diode emits a plurality of light beams.

The first light beam L1 emitted from the edge-emitting laser element 20*a* and the second light beam L2 emitted from the surface-emitting laser element 20*b* enter the optical member 50. The first light beam L1 and the second light beam L2, which have optical axes not parallel to each other, enter the optical member 50, and exit the optical member 50 as light beams traveling along the same axis. In the example shown in FIG. 2, the first light beam L1 and the second light beam L2 exit the optical member 50 as light beams traveling along the same axis in the second direction. The exited light beams traveling along the same axis travel toward the upper side of the light source device 100 through the cover portion of a cap described below.

The first embodiment can realize a small light source device in which the edge-emitting laser element and the surface-emitting laser element are mounted in one package. A plurality of light beams having optical axes not parallel to each other can be aligned by the optical member to travel along the same axis, and the light beams traveling along the same axis can be emitted upward from the light source device.

The light source device 100 is quadrilateral in a top view as illustrated in FIG. 1. The light source device may have other appropriate shape.

The size of the light source device 100 is, for example, about 1.0 mm to 30.0 mm in the X direction and is about 1.0 mm to 30.0 mm in the Y direction. The thickness of the light source device 100 in the Z direction can be about 0.5 mm to 6.0 mm.

Components of the light source device 100 will be described below in detail.

Substrate 10

The substrate 10 in the example shown in FIG. 1 is a plate-shaped member. The substrate 10 has the supporting surface 10*a* that directly or indirectly supports each of the edge-emitting laser element 20*a* and the surface-emitting laser element 20*b*. The thickness of the substrate 10 illustrated in FIG. 1 in the Z direction is, for example, about 0.1 mm to 1.0 mm. The supporting surface 10*a* can be provided with a film of a metal such as gold for bonding to other members such as the surface-emitting laser element 20*b*, a submount 30, and the lateral wall 60. The substrate 10 can be formed using a ceramic, a metal, glass, silicon, resin, or the like as the main material. The substrate 10 directly or indirectly supports each of the edge-emitting laser element 20*a* and the surface-emitting laser element 20*b* and can dissipate heat generated in each laser element. To improve the heat dissipation performance, the substrate 10 is preferably formed of a material having a high thermal conductivity such as AlN and a metal.

The substrate 10 can include a conductor wiring layer and an external connection electrode electrically connected to each of the edge-emitting laser element 20*a* and the surface-emitting laser element 20*b*. The conductor wiring layer and the external connection electrode can be formed of, for example, a metal material such as tungsten, molybdenum, nickel, gold, silver, platinum, titanium, copper, aluminum, and ruthenium.

Light-Emitting Element

Examples of a light-emitting element in the embodiments described in the present disclosure include laser diodes such as edge-emitting laser elements and surface-emitting laser elements. For example, a laser diode configured to emit blue light, a laser diode configured to emit green light, a laser diode configured to emit red light, or the like can be employed as the light-emitting element. Alternatively, laser diodes configured to emit light other than visible light, such as near-infrared light and ultraviolet light, may be employed.

In the present specification, blue light refers to light with a peak emission wavelength within the range of 420 nm to 494 nm. Green light refers to light with a peak emission wavelength within the range of 495 nm to 570 nm. Red light refers to light with a peak emission wavelength within the range of 605 nm to 750 nm.

The laser light emitted from the laser diode has divergence in the fast axis and slow axis directions and forms an elliptic or substantially circular far-field pattern (hereinafter referred to as "FFP") in a plane parallel to a light exit surface of the laser light. The shape of the FFP of the laser light emitted from the edge-emitting laser element can be elliptic, and the shape of the FFP of the laser light emitted from the surface-emitting laser element can be substantially circular. The FFP is defined by the light intensity distribution of the laser light at a position away from the light exit surface. The light traveling on the optical axis shows a peak intensity in the light intensity distribution of the FFP. A portion having intensities of $1/e^2$ or more of the peak intensity in this light intensity distribution may be referred to as a "beam section."

The statement "exit as light beams traveling along the same axis" as used in the present specification indicates that light beams are caused to travel in the same direction with at least a part of the beam cross section(s) of one or a plurality of first light beams L1 overlapping at least a part of the beam cross section(s) of one or a plurality of light beams L2. In other words, "exit as light beams traveling along the same axis" includes arrangements in which, in the cross-section perpendicular to the optical axes of the light beams, the light beams only partially overlap each other, or completely overlap each other with the light beams being coaxial or not coaxial. At the time of emission from the light source device 100, the distance between the optical axis of any one of the light beams L1 and the optical axis of any one of the light beams L2 is, for example, preferably 65 μm or less, more preferably 40 μm or less.

The light source device 100 illustrated in FIG. 1 or FIG. 2 includes one edge-emitting laser element 20*a* and one surface-emitting laser element 20*b*, but the number of light-emitting elements of each type is not limited to one. The light source device according to the embodiments of the present disclosure can include a plurality of light-emitting elements including one or more edge-emitting laser elements and/or one or more surface-emitting laser elements.

The edge-emitting laser element 20*a* may be a single emitter laser diode having one emitter or a multi-emitter laser diode having two or more emitters.

For the surface-emitting laser element 20*b*, a vertical-cavity surface-emitting laser (VCSEL) element, a photonic crystal surface-emitting laser (PCSEL) element, or the like may be used. The surface-emitting laser element 20*b* may be a single emitter laser diode having one emitter or a multi-emitter laser diode having two or more emitters. Hereinafter a vertical-cavity surface-emitting laser element is referred to as a VCSEL element. Examples in which a VCSEL element is used as the surface-emitting laser element will be illustrated in description of embodiments of the present disclosure. For example, the VCSEL element is superior to the edge-emitting laser element in that more circular beam shape is obtained, a two-dimensional array is comparatively easily obtained by two-dimensionally arranging a plurality of emitters, or the element can be operated with low power consumption.

Reference is made to FIG. 2 again. The edge-emitting laser element 20*a* is directly or indirectly supported by the supporting surface 10*a* of the substrate 10 and emits the first light beam L1 in the first direction. The surface-emitting laser element 20*b* is directly or indirectly supported by the supporting surface 10*a* and emits the second light beam L2 in the second direction. In the light source device 100 illustrated in FIG. 2, the edge-emitting laser element 20*a* is indirectly supported by the supporting surface 10*a* while being bonded to the submount 30, that is, with the submount 30 being disposed therebetween. The surface-emitting laser element 20*b* is bonded to the supporting surface 10*a* and is directly supported by the supporting surface 10*a*. As described below, the surface-emitting laser element 20*b* can be indirectly supported by the supporting surface 10*a* with a submount disposed therebetween.

The wavelength of the first light beam L1 may be the same as or different from the wavelength of the second light beam L2. The wavelength of the first light beam L1 can be within the range of, for example, 350 nm to 1,000 nm, and the wavelength of the second light beam L2 can be within the range of, for example, 400 nm to 950 nm. The minor axis of the beam diameter of the first light beam L1 may be the same as or different from the beam diameter of the second light beam L2.

In the embodiments described in the present disclosure, the edge-emitting laser element 20*a* can function as a high-output light source, and the surface-emitting laser element 20*b* can function as a low-output light source. The output of the surface-emitting laser element 20*b* is lower than the output of the edge-emitting laser element 20*a* by, for example, three orders of magnitude. For example, the output of the edge-emitting laser element 20*a* can be within the range of 0.01 W to 50 W. For example, the output of the surface-emitting laser element 20*b* can be within the range of 0.01 mW to 10 mW.

Submount 30

The submount 30 is a heat dissipation member and typically has the shape of a rectangular parallelepiped. The shape of the submount is not limited to this shape. The submount 30 is bonded to the supporting surface 10*a* of the substrate 10. The submount 30 has a function of releasing heat generated from the edge-emitting laser element 20*a*. In order to further enhance the heat dissipation performance, the submount 30 is preferably formed of a material with a thermal conductivity higher than the thermal conductivity of the edge-emitting laser element 20*a*. Examples of the material include ceramic materials such as aluminum nitride, silicon nitride, aluminum oxide, and silicon carbide, metal materials such as copper, aluminum, silver, iron, nickel, molybdenum, tungsten, and copper molybdenum, and diamond.

Supporting Member 40

Figure 3A:
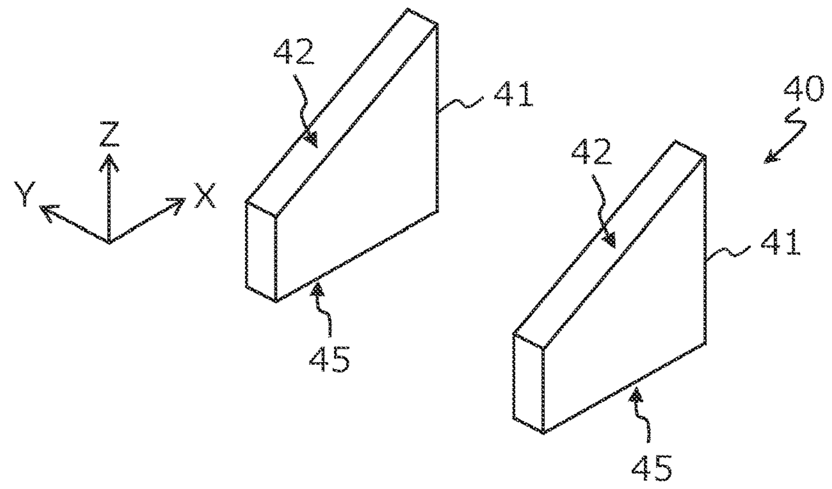
FIG. 3A is a schematic perspective view of a supporting member included in the light source device.

FIG. 3A is a schematic perspective view of a supporting member 40 included in the light source device 100 illustrated in FIG. 1. The supporting member 40 is a member that supports the optical member 50 described below. The supporting member 40 is bonded to the substrate 10 using an adhesive, solder, or the like. The bonding may be achieved by welding. The supporting member 40 illustrated in FIG. 3A includes a pair of supporting units 41 each having a supporting surface 42 that supports the optical member 50. The pair of supporting units 41 are spaced apart from each other in the Y direction and are fixed to the supporting surface 10*a* of the substrate 10. The pair of supporting units 41 each have a lower surface 45 bonded to the supporting surface 10*a* of the substrate 10. The supporting surface 42 is an inclined surface inclined at a predetermined inclination angle with respect to the supporting surface 10*a*. For example, the inclination angle is set within the range of 30° or more and 60° or less. The supporting surface 42 in the example shown in FIG. 3A is an inclined surface inclined at an angle of 45° with respect to the supporting surface 10*a*.

Figure 3B:
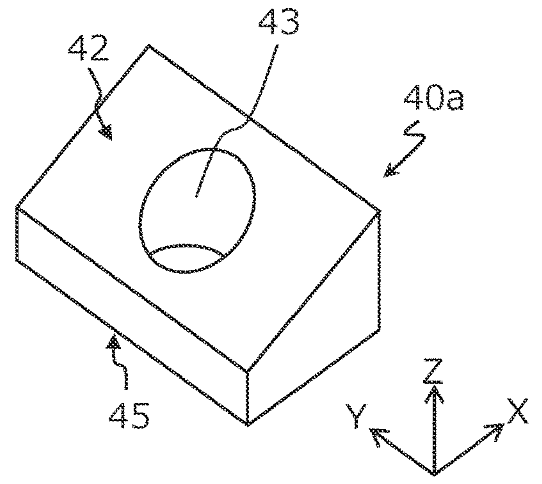
FIG. 3B is a schematic perspective view of another example of the constitution of the supporting member.
Figure 3C:
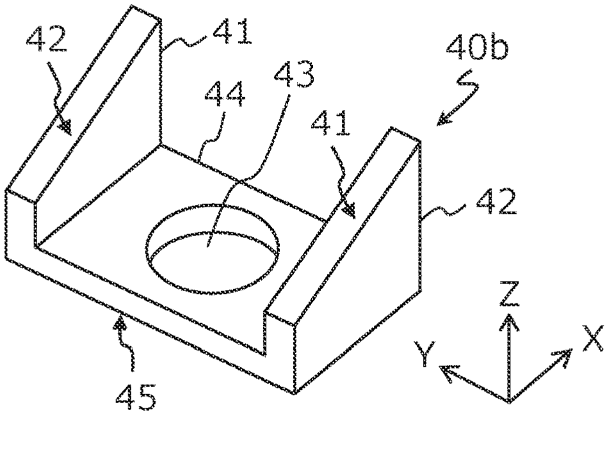
FIG. 3C is a schematic perspective view of still another example of the constitution of the supporting member.

Each of FIG. 3B and FIG. 3C is a schematic perspective view of another example of the constitution of the supporting member. A supporting member 40*a* illustrated in FIG. 3B has a supporting surface 42 and a through hole 43 extending in the Z direction. The surface-emitting laser element 20*b* is disposed inside the through hole 43. The through hole 43 is spaced apart from a portion on which an adhesive, solder, or the like used for bonding the substrate 10 and/or the optical member 50 to the supporting member 40 is applied or a portion on which the substrate 10 and/or the optical member 50 is welded to the supporting member 40. A supporting member 40*b* illustrated in FIG. 3C includes a pair of supporting units 41 and a connecting unit 44 connecting the pair of supporting units 41 on the lower side. The supporting member 40*b* has a structure in which the pair of supporting units 41 and the connecting unit 44 are integrally formed. The pair of supporting units 41 may be members separated from the connecting unit 44. The connecting unit 44 has a through hole 43 extending in the Z direction. The surface-emitting laser element 20*b* is disposed inside the through hole 43. The supporting members 40*a* and 40*b* each have a lower surface 45 bonded to the supporting surface 10*a* of the substrate 10. The supporting member is only required to have a structure that supports the optical member 50 so that a first incident surface 51 and a second incident surface 52 of the optical member 50 described below will be inclined with respect to the optical axis of the first light beam L1 and the optical axis of the second light beam L2, and the structure of the supporting member is not limited to the examples shown in the drawings. The supporting member 40 can be formed of a material such as a metal, a ceramic, and glass.

Optical Member 50

The optical member 50 in the embodiments described the present disclosure has a configuration that allows the first light beam L1 and the second light beam L2, having optical axes not parallel to each other, to exit the optical member 50 as light beams traveling along the same axis. The optical member 50 is bonded to the supporting member 40 using an adhesive, solder, or the like. The optical member 50 may be bonded to the supporting member 40 by welding. The optical member 50 illustrated in FIG. 2 is a dichroic mirror. The optical member 50 illustrated in FIG. 2 allows the first light beam L1 and the second light beam L2 to exit toward the upper side of the light source device 100 (that is, in the second direction) as light beams traveling along the same axis. For example, the optical member 50 can be formed of at least one selected from the group consisting of glass, quartz, synthetic quartz, sapphire, and a transparent ceramic.

The optical member 50 has the first incident surface 51 inclined with respect to the supporting surface 10*a* and the second incident surface 52 inclined with respect to the supporting surface 10*a*. In the example shown in FIG. 2, the first incident surface 51 is parallel to the second incident surface 52. The first incident surface 51 is not required to be strictly parallel to the second incident surface 52, and this "parallel" can include a difference of ±1°. The first light beam L1 is incident on the first incident surface 51, and the second light beam L2 is incident on the second incident surface 52.

The optical member 50 illustrated in FIG. 1 is supported by the supporting surface(s) 42 of the supporting member 40, 40*a*, or 40*b* shown in FIG. 3A, FIG. 3B, or FIG. 3C. The first incident surface 51 and the second incident surface 52 of the optical member 50 is therefore inclined at 45°, which corresponds to the inclination angle of the supporting surface(s) 42 of the supporting member 40 described above, with respect to the supporting surface 10*a*. The optical member 50 covers at least a part of the surface-emitting laser element 20*b* in a top view.

In the case in which the wavelength of the first light beam L1 differs from the wavelength of the second light beam L2, for example, the optical member 50 includes a dichroic mirror. The dichroic mirror includes a dielectric multilayer film having predetermined wavelength selectivity and including a plurality of dielectric layers and can be designed such that the transmittance and the reflectance vary according to the wavelength. Such a dielectric multilayer film is disposed on the first incident surface 51 in the light source device 100 shown in FIG. 2. The dielectric multilayer film can be formed of $Ta_2O_5$, $SiO_2$, $TiO_2$, $Nb_2O_5$, SiON, or the like.

In the case in which the wavelength of the first light beam L1 is the same as the wavelength of the second light beam L2, for example, a polarizing beam splitter can be used as the optical member. The polarizing beam splitter in this case functions as a coupler. Each of the edge-emitting laser element 20*a* and the surface-emitting laser element 20*b* can emit a linearly polarized laser beam. For example, the surface-emitting laser element 20*b* is disposed on the supporting surface 10*a* such that the directions of linear polarization of the first light beam L1 and the linear polarization of the second light beam L2 are orthogonal to each other. For example, in the case in which a s-polarized first light beam L1 is incident on the first incident surface 51, the surface-emitting laser element 20*b* is disposed on the supporting surface 10*a* such that a p-polarized second light beam L2 is incident on the second incident surface 52. The first light beam L1 and the second light beam L2 having orthogonal directions of polarization exit the polarizing beam splitter as light beams traveling along the same axis.

For example, the first incident surface 51 and/or the second incident surface 52 is a partial reflection surface. The partial reflection surface reflects a part of incident light and transmits the remaining light. For example, a reflectance control film can be formed on the first incident surface 51 and/or the second incident surface 52. For example, the reflectance control film can be the dielectric multilayer film described above. The reflectance or transmittance of the reflection surface can be controlled by changing the thickness and/or the material of the reflectance control film. The reflectance depends on the wavelength of light and the term "reflectance" as used in the present disclosure refers to the reflectance at the peak wavelength of laser light emitted from the light-emitting element.

The positions of the edge-emitting laser element 20*a* and the surface-emitting laser element 20*b* are determined on the basis of the position of the optical member 50 such that the first light beam L1 emitted from the edge-emitting laser element 20*a* and reflected at the first incident surface 51 and the second light beam L2 emitted from the surface-emitting laser element 20*b*, transmitted through the optical member 50, and emitted from the first incident surface 51 travel along the same axis.

In the light source device 100 shown in FIG. 2, the first incident surface 51 of the optical member 50 reflects a part of the incident first light beam L1 in the second direction, that is, in the Z direction. The first incident surface 51 is adjusted to have a reflectance of, for example, 80% or more for the first light beam L1.

The second light beam L2 emitted from the surface-emitting laser element 20*b* passes through an interface present between a gas and a solid when incident on the second incident surface 52 of the optical member 50. The interface corresponds to the second incident surface 52. The "gas" is air, an inert gas, or the like present inside a space V of a package described below. For example, the "solid" is glass constituting the optical member 50. While the refractive index of a gas such as air is about 1.0, the refractive index of glass is, for example, 1.4 or more. The interface is therefore an interface between a dielectric substance (air) having a relatively low refractive index and a dielectric substance (glass) having a relatively high refractive index. The second incident surface 52 is adjusted to have a transmittance of, for example, 80% or more for the second light beam L2. The second light beam L2 incident on the second incident surface 52 is refracted at the interface, and accordingly, the direction of the optical axis of the second light beam L2 is changed. The refractive index varies according to the wavelength, and the inclination angle of the optical member 50 with respect to the supporting surface 10*a* can be adjusted according to the wavelengths of the first light beam L1 and the second light beam L2.

The second light beam L2 passes through an interface present between a solid and a gas when transmitted through the optical member 50 and emitted from the first incident surface 51. The interface corresponds to the first incident surface 51. The first incident surface 51 is adjusted to have a transmittance of, for example, 80% or more for the second light beam L2. The second light beam L2 incident on the first incident surface 51 is refracted at the interface, and the direction of the beam is accordingly changed, so that the beam is emitted from the first incident surface 51 in the second direction. That is, the first incident surface 51 emits a part of the second light beam L2 that has been incident on the second incident surface 52 and transmitted through the optical member 50 in the second direction.

In this manner, a part of the first light beam L1 reflected at the first incident surface 51 and a part of the second light beam L2 emitted from the first incident surface 51 exit the optical member 50 as light beams traveling in the second direction along the same axis.

Lateral Wall 60

The lateral wall 60 is disposed to surround the edge-emitting laser element 20*a* and the surface-emitting laser element 20*b* and is bonded to a peripheral region of the supporting surface 10*a* of the substrate 10. The lateral wall 60 has an upper surface 60*a*, a lower surface 60*b*, and an inner wall surface 60*c*. The inner wall surface 60*c* surrounds the edge-emitting laser element 20*a* and the surface-emitting laser element 20*b*. The inner wall surface 60*c* defines the space V accommodating the edge-emitting laser element 20*a*, the surface-emitting laser element 20*b*, and the optical member 50. For example, the thickness of the lateral wall 60 illustrated in FIG. 1 in the Z direction is about 0.4 mm to 3.8 mm.

The lower surface 60*b* of the lateral wall 60 is bonded to the supporting surface 10*a* of the substrate 10. The bonding can be achieved via a joint formed of an inorganic material or an organic material. Examples of the material of the joint include a metal such as gold tin and a solder alloy and metal paste such as gold paste and silver paste. In the case in which a light-emitting element that emits blue or green light is used, the optical density is high, and light-emitting element is likely to attract dust of organic matter. It is therefore preferable to avoid use of organic materials in this case.

Cover Portion 70

The cover portion 70 is a member located above the lateral wall 60. The cover portion 70 is supported by the upper surface 60*a* of the lateral wall 60. The example shown in FIG. 2 is not limiting, and the cover portion 70 can be sandwiched between portions of the lateral wall 60 located apart from each other in the X direction. In this case, the cover portion 70 is bonded to, for example, the inner wall surface 60*c* of the upper part of the lateral wall 60. In the description of embodiments of the present disclosure, the portion constituted of the lateral wall 60 and the cover portion 70 in the light source device is referred to as a "cap."

In other words, the light source device 100 includes the cap supported by the supporting surface 10*a*. The cap includes the lateral wall 60 and the cover portion 70. Alternatively, the cover portion 70 may be referred to as the "cap."

The cap covers the edge-emitting laser element 20*a*, the surface-emitting laser element 20*b*, and the optical member 50. The cap and the substrate 10 may be collectively referred to as a "package."

The space V is preferably hermetically sealed. The term "hermetic sealing" as used in the present specification refers to sealing to the extent that convection with the outside air in the space V is intercepted. Hermetic sealing allows a member disposed in the space V to be less likely to deteriorate. Further, the influence of the dust collection can be reduced. The cover portion 70 can be integrally formed with the lateral wall 60. The cover portion 70 can have function as a condensing lens or a collimating lens.

In the embodiments described in the present disclosure, the substrate 10, the lateral wall 60, and the cover portion 70 define a sealed space. The edge-emitting laser element 20*a*, the surface-emitting laser element 20*b*, and the optical member 50 are disposed in the sealed space.

In the light source device 100 illustrated in FIG. 2, for example, at least a portion of the cover portion 70 transmitting the light beam can be formed of a material such as alkali glass, alkali-free glass, sapphire, glass containing a phosphor, and a transparent ceramic material. For example, the portion of the cover portion 70 not transmitting the light beam can be formed of silicon, glass, a ceramic, or the same material as for the lateral wall 60 described above. An anti-reflection film can be disposed on a surface configured to receive the light beam and/or a surface configured to emit the light beam of the portion of the cover portion 70 transmitting the light beam.

The light source device 100 according to the first embodiment can realize a small light source device in which the edge-emitting laser element 20*a* and the surface-emitting laser element 20*b* are mounted in one package. The first and second light beams L1 and L2 respectively emitted from the edge-emitting laser element 20*a* and the surface-emitting laser element 20*b* can be aligned by the optical member 50 to be emitted along the same axis toward the upper side of the light source device. For example, the edge-emitting laser element 20*a* can function as a high-output light source, and the surface-emitting laser element 20*b* can function as a low-output light source. A convenient light source device that can be used in different applications as a single light source device can therefore be provided. The high-output light source and the low-output light source can be operated simultaneously or at different timings. A single light source device can therefore be simultaneously used in different applications. For example, it is possible that, while a light beam emitted from the low-output light source is caused to irradiate a region to be subjected to laser treatment and light reflected from the region is sensed to evaluate the state of the region under laser treatment, light beam emitted from the high-output light source is caused to irradiate the region to perform medical treatment.

Allowing the light beams emitted from the edge-emitting laser element 20*a* and the surface-emitting laser element 20*b* to travel along the same axis allows for miniaturizing a rear optical system that can be disposed outside the light source device for condensing or collimating light beams emitted from the light source device. Further, alignment of light in the rear optical system can also be facilitated.

Each of the edge-emitting laser element and the surface-emitting laser element in the example described above is a single emitter laser diode, but the present disclosure is not limited thereto. For example, a single emitter laser diode may be used as the edge-emitting laser element, and a multi-emitter laser diode may be used as the surface-emitting laser element. In this case, the arrangement of the edge-emitting laser element and the surface-emitting laser element with respect to the optical member is determined such that the optical member aligns the light beam emitted from the emitter of the edge-emitting laser element and at least one of a plurality of light beams emitted from a plurality of emitters of the surface-emitting laser element along the same axis. In an example, the optical axis of the light beam emitted from an emitter located closer to the center of the light exit surface among a plurality of emitters arranged in an array on the light exit surface of the surface-emitting laser element and the optical axis of the light beam emitted from the emitter of the edge-emitting laser element can be caused to travel along the same axis.

In another aspect, the light source device according to one embodiment of the present disclosure can include a plurality of surface-emitting laser elements. In such a light source device, for example, two or more secondary surface-emitting laser elements can be disposed around one main surface-emitting laser element to surround the main surface-emitting laser element. In this case, at least the light beam emitted from the main surface-emitting laser element and the light beam emitted from the edge-emitting laser element can be caused to travel along the same axis.

Second Embodiment

Figure 4:
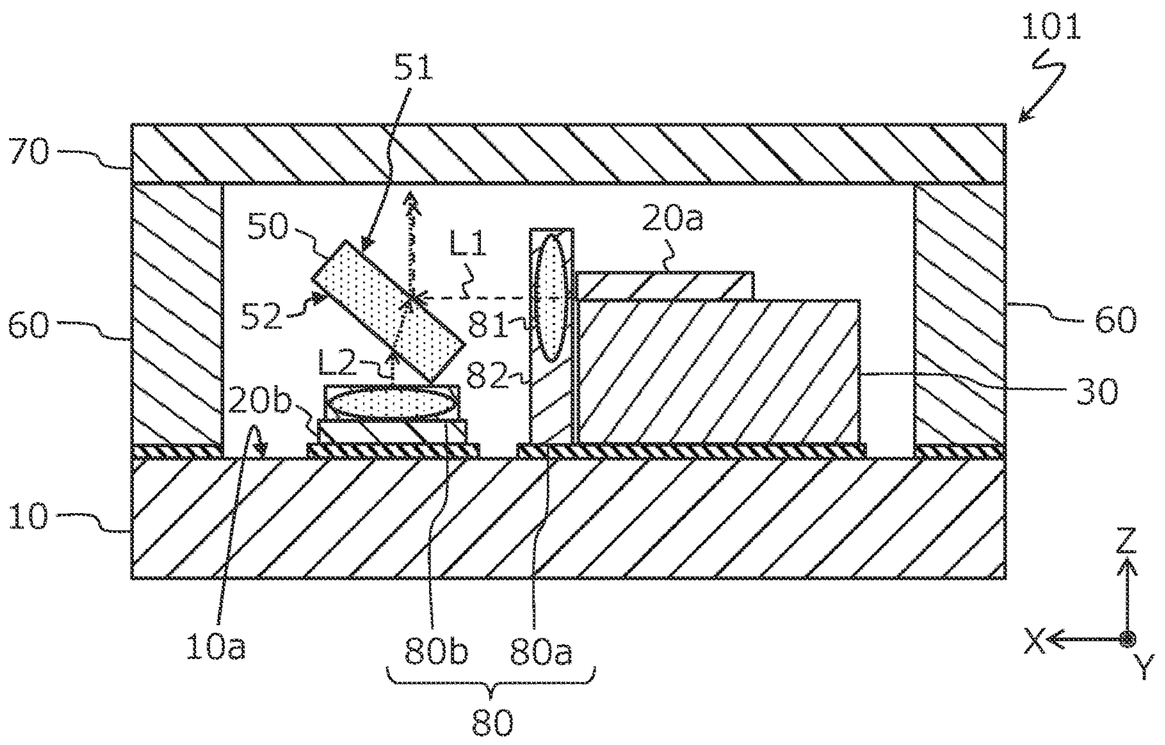
FIG. 4 is a schematic cross-sectional view of a light source device according to a second embodiment taken along a plane parallel to the XZ-plane.

FIG. 4 is a schematic cross-sectional view of a light source device 101 according to a second embodiment taken along a plane parallel to the XZ-plane. The light source device 101 illustrated in FIG. 4 has a constitution in which a lens unit 80 is disposed in the light source device 100. The other part of the constitution is the same as in the light source device 100.

Lens Unit 80

The light source device 101 illustrated in FIG. 4 includes the lens unit 80 including a first lens unit 80*a* and a second lens unit 80*b*. The first lens unit 80*a* is disposed on the substrate 10 or the submount 30 at a location on the optical path of the first light beam L1 between the edge-emitting laser element 20*a* and the optical member 50. In the case in which the first lens unit 80*a* is disposed on the substrate 10, the first lens unit 80*a* can be adjusted in a state in which the lateral wall 60 and the cover portion 70 are not bonded to the substrate 10. In the case in which the first lens unit 80*a* is disposed on the submount 30, the first lens unit 80*a* can be adjusted when the first lens unit 80*a* is disposed on the submount 30. The adjustment indicates adjustment of the position, beam angle, beam diameter, degree of collimation, and the like of the first lens unit 80*a* with respect to a certain target. The second lens unit 80*b* is disposed between the surface-emitting laser element 20*b* and the optical member 50 and on the optical path of the second light beam L2. The light source device 101 may include the first lens unit 80*a* but not include the second lens unit 80*b*, or, conversely, the light source device 101 may include the second lens unit 80*b* but not include the first lens unit 80*a*. In the light source device 101 illustrated in FIG. 4, the first lens unit 80*a* is disposed on the substrate 10 on the light exit surface side of the edge-emitting laser element 20*a* on the optical path of the first light beam L1. The second lens unit 80*b* is disposed on the light exit surface of the surface-emitting laser element 20*b*.

Each of the first lens unit 80*a* and the second lens unit 80*b* includes a lens 81 and a holding portion 82 for holding the lens 81. Examples of the lens 81 include a collimating lens and a condensing lens. The lens 81 can include one or more of a spherical lens such as a biconvex lens and a plano-convex lens and an aspherical lens. Each lens unit can be formed of, for example, at least one selected from the group consisting of glass, quartz, synthetic quartz, sapphire, and a transparent ceramic. The lens 81 and the holding portion 82 may be integrally formed of the same material or may be separately formed of different materials. In the case in which the lens 81 and the holding portion 82 are separately formed, the holding portion 82 can be formed of a material such as a metal and a ceramic.

In the case in which the lens unit is provided for each of the edge-emitting laser element 20*a* and the surface-emitting laser element 20*b* and in which the wavelengths of the first light beam L1 and the second light beam L2 differ from each other, the degree of collimation of the first light beam L1 by the first lens unit 80*a* may differ from the degree of collimation of the second light beam L2 by the second lens unit 80*b*. For example, the degrees of collimation can be made different from each other by changing the lens shapes or the curvatures of the lenses. Having different degrees of collimation can facilitate alignment of light in a rear optical system disposed outside the light source device in the case in which the alignment is required. For example, if the first light beam L1 and the second light beam L2 have different wavelengths in a rear optical system including a condensing lens, the focal points are different according to the difference in wavelength. Even in such a case, the first light beam L1 and the second light beam L2 can be condensed to the same point by the condensing lens by making the degrees of collimation different from each other and defocusing the first light beam L1 or the second light beam L2.

Third Embodiment

Figure 5:
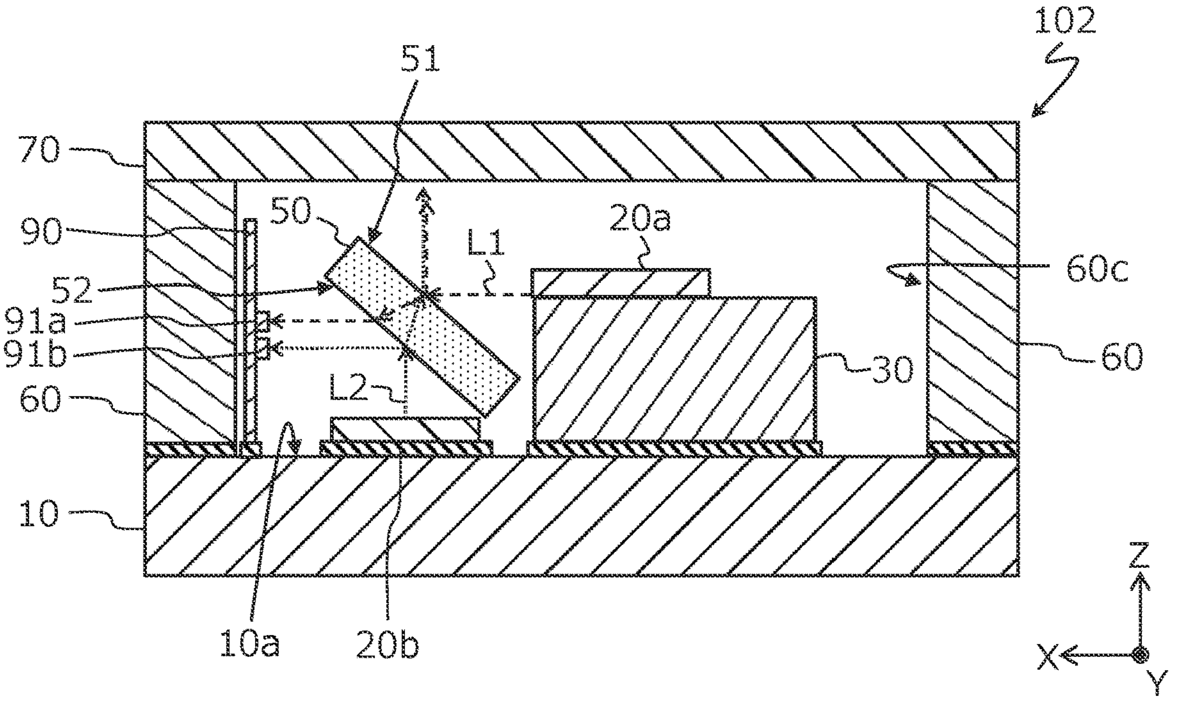
FIG. 5 is a schematic cross-sectional view of a light source device according to a third embodiment taken along a plane parallel to the XZ-plane.

FIG. 5 is a schematic cross-sectional view of a light source device 102 according to a third embodiment taken along a plane parallel to the XZ-plane. The light source device 102 illustrated in FIG. 5 has a constitution in which a photodetector 90 is disposed in the light source device 100. The other part of the constitution is the same as in the light source device 100.

Photodetector 90

The light source device 102 illustrated in FIG. 5 includes the photodetector 90. The photodetector 90 monitors the intensity of each of the first light beam L1 and the second light beam L2. The photodetector 90 includes light receiving units 91*a* and 91*b*. Examples of the light receiving units include photoelectric conversion elements such as photodiodes. A part of the first light beam L1 emitted from the second incident surface 52 is incident on the light receiving unit 91*a*. A part of the second light beam L2 reflected at the second incident surface 52 is incident on the light receiving unit 91*b*. Each light receiving unit receives a part of the light beam emitted from the light-emitting element and monitors the intensity of the light beam. The intensity of the light beam can be referred to as optical power. The light receiving units 91*a* and 91*b* can be disposed apart from each other in the Z direction to the extent that the beam cross sections of the first light beam L1 and the second light beam L2 do not overlap each other. The light receiving units 91*a* and 91*b* may be disposed apart from each other in the Y direction as long as the beam cross sections of the first light beam L1 and the second light beam L2 do not overlap each other.

The photodetector 90 requires a monitor beam of, for example, about 5 mW in order to monitor the intensity of the light beam emitted from each light-emitting element. In the embodiments described in the present disclosure, for example, about 5% of the light beam emitted from the light-emitting element is used as the monitor beam, and the remaining beam constituting about 95% is extracted to the outside.

The photodetector 90 is located on the side opposite to the edge-emitting laser element 20*a* with respect to the optical member 50 in the first direction. The photodetector 90 in the light source device 102 illustrated in FIG. 5 is located close to the lateral wall 60 and is bonded to the supporting surface 10*a* via the joint described above. The photodetector 90 can be bonded to the inner wall surface 60*c* of the lateral wall 60 and supported by the lateral wall 60.

The second incident surface 52 reflects a part of the incident second light beam L2 in the first direction to direct the part toward the light receiving unit 91*b*. The second incident surface 52 further emits the first light beam L1 that has been incident on the first incident surface 51 and transmitted through the optical member 50 in the first direction to direct the beam toward the light receiving unit 91*a*.

The reflectance control film described above may have the same constitution as an optical film called "anti-reflection film." However, a common anti-reflection film has an extremely low reflectance such as a reflectance of 0.5% or less to reduce reflection as much as possible. On the other hand, in the embodiment described in the present disclosure, reflected light at a level required for the monitoring is required to be obtained from the second incident surface 52. For example, the reflectance of the reflectance control film for the second light beam L2 is therefore determined within the range of 1% or more and 10% or less. The reflectance control film may be provided such that the second incident surface 52 has a reflectance of less than 1%, or the reflectance control film may be provided to achieve a reflectance of 0.5% or less as with a common anti-reflection film.

A diffractive optical element such as a reflection grating may be formed on the second incident surface 52 instead of the reflectance control film. The light beam L2 diffracted by the diffractive optical element travels toward the light receiving unit 91*b* as the monitor beam, and the light beam L2 not diffracted by the diffractive optical element passes through the diffractive optical element and travels toward the first incident surface 51.

Fourth Embodiment

Figure 6:
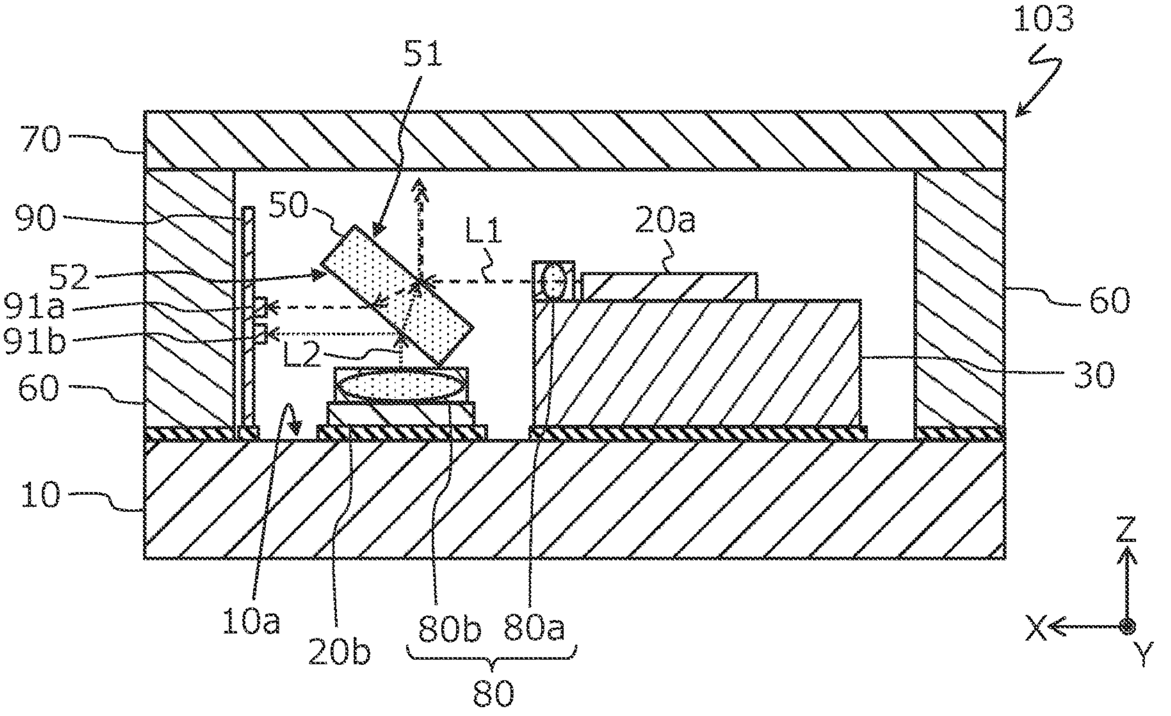
FIG. 6 is a schematic cross-sectional view of a light source device according to a fourth embodiment taken along a plane parallel to the XZ-plane.

FIG. 6 is a schematic cross-sectional view of a light source device 103 according to a fourth embodiment taken along a plane parallel to the XZ-plane. The light source device 103 illustrated in FIG. 6 has a constitution in which the first lens unit 80*a*, the second lens unit 80*b*, and the photodetector 90 are disposed in the light source device 100. The other part of the constitution is the same as in the light source device 100. As in the light source device 103, structures of a plurality of embodiments may be combined. The first lens unit 80*a*, the second lens unit 80*b*, and the photodetector 90 respectively act in the same manner as the first lens unit 80*a* and the second lens unit 80*b* in the light source device 101 and the photodetector 90 in the light source device 102.

Fifth Embodiment

Figure 7:
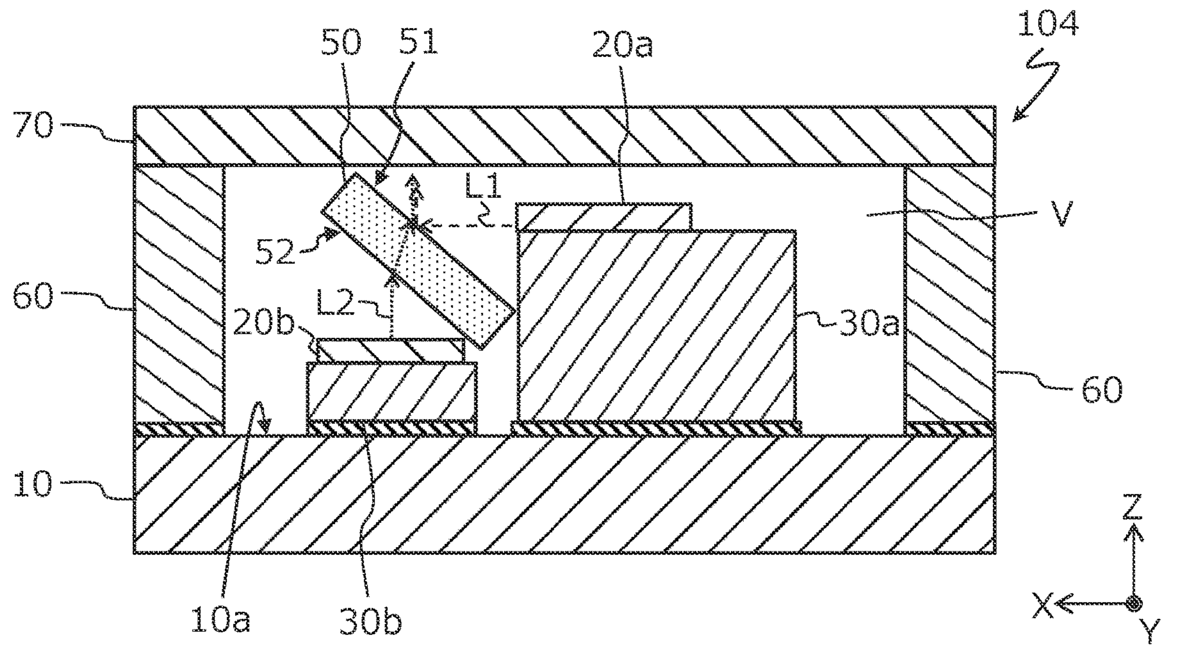
FIG. 7 is a schematic cross-sectional view of a light source device according to a fifth embodiment taken along a plane parallel to the XZ-plane.

FIG. 7 is a schematic cross-sectional view of a light source device 104 according to a fifth embodiment taken along a plane parallel to the XZ-plane. The light source device 104 illustrated in FIG. 7 has a constitution in which a first submount 30*a* and a second submount 30*b* are disposed in the light source device 100. The other part of the constitution is the same as in the light source device 100. The first submount 30*a* corresponds to the submount 30 described above. The edge-emitting laser element 20*a* is indirectly supported by the supporting surface 10*a* with the first submount 30*a* bonded to the supporting surface 10*a* disposed therebetween. The surface-emitting laser element 20*b* is indirectly supported by the supporting surface 10*a* with the second submount 30*b* bonded to the supporting surface 10*a* disposed therebetween. The thickness of the first submount 30*a* is larger than the thickness of the second submount 30*b* as shown in FIG. 7.

By disposing the edge-emitting laser element 20*a* and the surface-emitting laser element 20*b* respectively on the different submounts, thermal interference from the edge-emitting laser element 20*a* that generates a relatively large amount of heat to the surface-emitting laser element 20*b* that generates a relatively small amount of heat can be reduced. The heat dissipation performance of the package can thus be improved. Separately adjusting the thicknesses of the first submount 30*a* and the second submount 30*b* can respectively facilitate changing the height from the light-emitting region of the edge-emitting laser element 20*a* to the supporting surface 10*a* and the height from the light-emitting region of the surface-emitting laser element 20*b* to the supporting surface 10*a*. This can facilitate alignment of the optical axes of the first light beam L1 and the second light beam L2 by the optical member 50.

Sixth Embodiment

Figure 8:
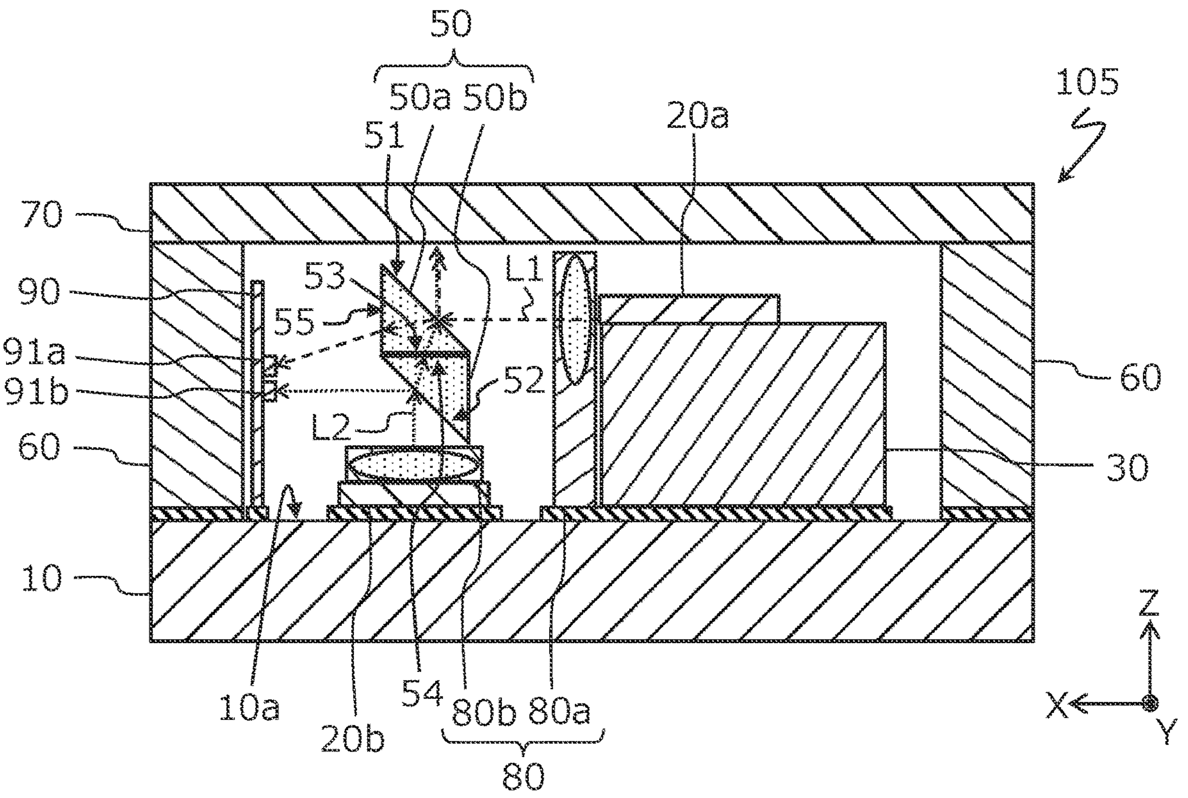
FIG. 8 is a schematic cross-sectional view of a light source device according to a sixth embodiment taken along a plane parallel to the XZ-plane.

FIG. 8 is a schematic cross-sectional view of a light source device 105 according to a sixth embodiment taken along a plane parallel to the XZ-plane. The light source device 105 illustrated in FIG. 8 has a constitution in which an optical member 50 including a first prism mirror 50*a* and a second prism mirror 50*b* is disposed in the light source device 103 instead of the flat-plate-shaped optical member 50. The other part of the constitution is the same as in the light source device 103. The first lens unit 80*a*, the second lens unit 80*b*, and the photodetector 90 are included, but the first lens unit 80*a*, the second lens unit 80*b*, and the photodetector 90 are not essential.

The first prism mirror 50*a* has the first incident surface 51 inclined at a first inclination angle with respect to the supporting surface 10*a*, a first lower surface 53, and an exit surface 55 facing the inner wall surface 60*c* of the lateral wall 60. The second prism mirror 50*b* has the second incident surface 52 inclined at a second inclination angle with respect to the supporting surface 10*a* and a second lower surface 54 facing the first lower surface 53. An adhesive layer can be disposed between the first lower surface 53 and the second lower surface 54. The first light beam L1 is incident on the first incident surface 51, and the second light beam L2 is incident on the second incident surface 52.

The first inclination angle corresponds to an angle formed by the first incident surface 51 and the first lower surface 53. The second inclination angle corresponds to an angle formed by the second incident surface 52 and the second lower surface 54. For example, each of the first inclination angle and the second inclination angle can be 30° or more and 60° or less.

In the light source device 105 illustrated in FIG. 8, each of the first prism mirror 50*a* and the second prism mirror 50*b* is a rectangular prism mirror. The first prism mirror 50*a* and the second prism mirror 50*b* are disposed such that the first lower surface 53 overlaps the second lower surface 54 in a top view and that the first incident surface 51 and the second incident surface 52 are parallel to each other. The first inclination angle is equal to the second inclination angle. For example, each of the first inclination angle and the second inclination angle is 45°. The first inclination angle and the second inclination angle may be different from each other.

For example, at least one of the first prism mirror 50*a* and the second prism mirror 50*b* can be a wedge prism. For example, the second prism mirror 50*b* can be replaced with a wedge prism. Use of the wedge prism can facilitate adjustment of the angle of deviation of the second light beam L2 by a minute angle.

The first incident surface 51 reflects a part of the first light beam L1 emitted from the edge-emitting laser element 20*a* in the second direction. A part of the first light beam L1 not reflected at the first incident surface 51 is refracted at the first incident surface 51 and transmitted through the first prism mirror 50*a*. The part of the first light beam L1 transmitted through the first prism mirror 50*a* is further refracted at the exit surface 55 and emitted toward the light receiving unit 91*a* of the photodetector 90. The second incident surface 52 reflects a part of the second light beam L2 emitted from the surface-emitting laser element 20*b* in the first direction to direct the part toward the light receiving unit 91*b*. A part of the second light beam L2 not reflected at the second incident surface 52 is refracted at the second incident surface 52 and transmitted through the second prism mirror 50*b*. The part of the second light beam L2 transmitted through the second prism mirror 50*b* is refracted at the interface between the first lower surface 53 and the second lower surface 54 and transmitted through the first prism mirror 50*a*. The part of the second light beam L2 transmitted through the second prism mirror 50*b* and the first prism mirror 50*a* in this order is further refracted at the first incident surface 51 and emitted in the second direction.

The first incident surface 51 is adjusted to have a reflectance of, for example, 80% or more for the first light beam L1. In other words, the first incident surface 51 is adjusted to have a transmittance of, for example, less than 20% for the first light beam L1. The second incident surface 52 is adjusted to have a reflectance of, for example, less than 20% for the second light beam L2. In other words, the second incident surface 52 is adjusted to have a transmittance of, for example, 80% or more for the second light beam L2.

In this manner, in the light source device 105 illustrated in FIG. 8, a part of the first light beam L1 reflected at the first incident surface 51 and a part of the second light beam L2 emitted from the first incident surface 51 exit the optical member 50 as light beams traveling in the second direction along the same axis. The light beams traveling along the same axis are emitted from the light source device 105 upward through the cover portion 70 of the cap.

Use of the two prism mirrors improves the accuracy when the directions of emission of the first light beam L1 and the second light beam L2 are adjusted.

The constitution of the light source device 105 described above is not limiting, and the optical axis of the second light beam L2 emitted from the surface-emitting laser element 20*b* can be caused to be inclined with respect to the normal direction of the supporting surface 10*a* by employing another constitution. Examples of the constitution of such a light source device are described with reference to FIG. 9 and FIG. 10.

Seventh Embodiment

Figure 9:
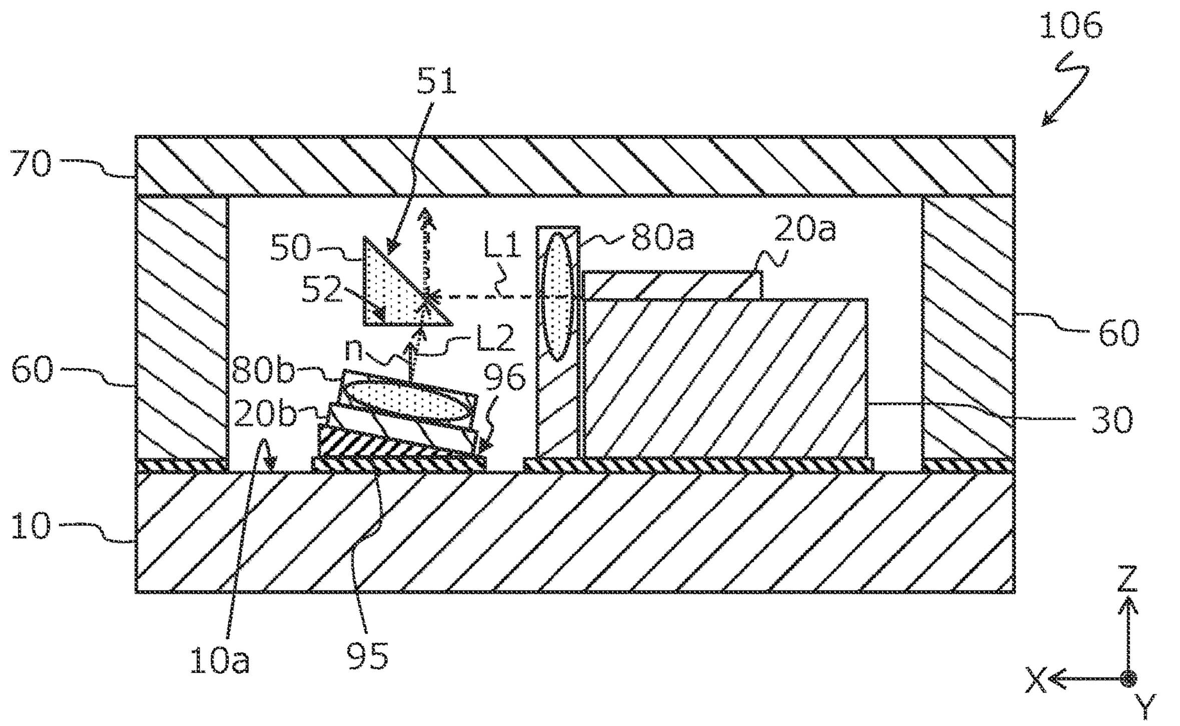
FIG. 9 is a schematic cross-sectional view of a light source device according to a seventh embodiment taken along a plane parallel to the XZ-plane.

FIG. 9 is a schematic cross-sectional view of a light source device 106 according to a seventh embodiment taken along a plane parallel to the XZ-plane. The normal direction of the supporting surface 10*a* is indicated by a solid arrow n in FIG. 9. The light source device 106 illustrated in FIG. 9 includes a pedestal 95 and further includes a prism mirror as the optical member 50. The pedestal 95 has an inclined surface 96 inclined at a third inclination angle with respect to the supporting surface 10*a* and is bonded to the supporting surface 10*a*. For example, the pedestal 95 can be formed of the same material as the submount 30 and function as a submount. The third inclination angle is an angle formed by the solid arrow n and the dotted arrow indicating the optical axis of the second light beam L2 and is, for example, 2° or more and 10° or less. The surface-emitting laser element 20*b* is bonded to the inclined surface 96 of the pedestal 95.

The optical member 50 in the example shown in FIG. 9 is a rectangular prism mirror. The optical member 50 has the first incident surface 51 inclined at the first inclination angle with respect to the supporting surface 10*a* and the second incident surface 52 parallel to the supporting surface 10*a*. The first light beam L1 is incident on the first incident surface 51, and the second light beam L2 is incident on the second incident surface 52. In this manner, the pedestal 95 can cause the optical axis of the second light beam L2 emitted from the surface-emitting laser element 20*b* to be inclined at an angle equal to the third inclination angle with respect to the normal direction of the supporting surface 10*a* before the second light beam L2 is incident on the second incident surface 52. Accordingly, the directions of emission of the first light beam L1 and the second light beam L2 can be adjusted with a single prism mirror.

Eighth Embodiment

Figure 10:
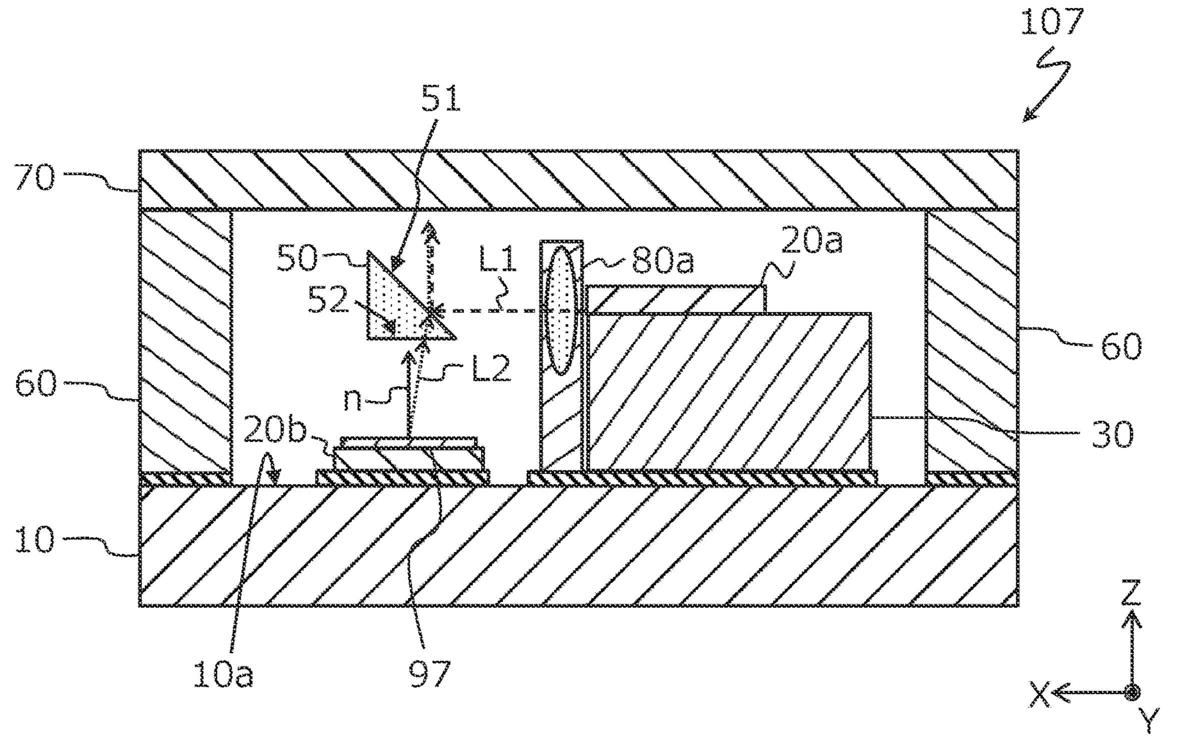
FIG. 10 is a schematic cross-sectional view of a light source device according to an eighth embodiment taken along a plane parallel to the XZ-plane.

FIG. 10 is a schematic cross-sectional view of a light source device 107 according to an eighth embodiment taken along a plane parallel to the XZ-plane. The normal direction of the supporting surface 10*a* is indicated by a solid arrow n in FIG. 10. The light source device 107 illustrated in FIG. 10 includes a light controlling element 97 instead of the pedestal 95. The light controlling element 97 changes the inclination of the optical axis of the second light beam L2 with respect to the normal direction of the supporting surface 10*a*. Examples of the light controlling element 97 include a diffractive optical element such as a transmission grating and fine protrusions and depressions having a size of equal to or smaller than the wavelength of the light beam. The light controlling element 97 can be disposed on the light exit surface of the surface-emitting laser element 20*b* or the second incident surface 52. The light controlling element 97 in the example shown in FIG. 10 is disposed on the light exit surface of the surface-emitting laser element 20*b*. In this manner, the light controlling element 97 can cause the optical axis of the second light beam L2 emitted from the surface-emitting laser element 20*b* to be inclined at a desired angle with respect to the normal direction of the supporting surface 10*a* before the second light beam L2 is incident on the second incident surface 52. Accordingly, the directions of emission of the first light beam L1 and the second light beam L2 can be adjusted with a single prism mirror.

The optical member 50 is not limited to the examples described above and can be configured in which the first light beam L1 and the second light beam L2 exit optical member 50 as light beams traveling along the same axis toward a lateral side (that is, in the first direction) of the light source device. Examples of the structure of such a light source device are described below with reference to FIG. 11 to FIG. 13.

Ninth Embodiment

Figure 11:
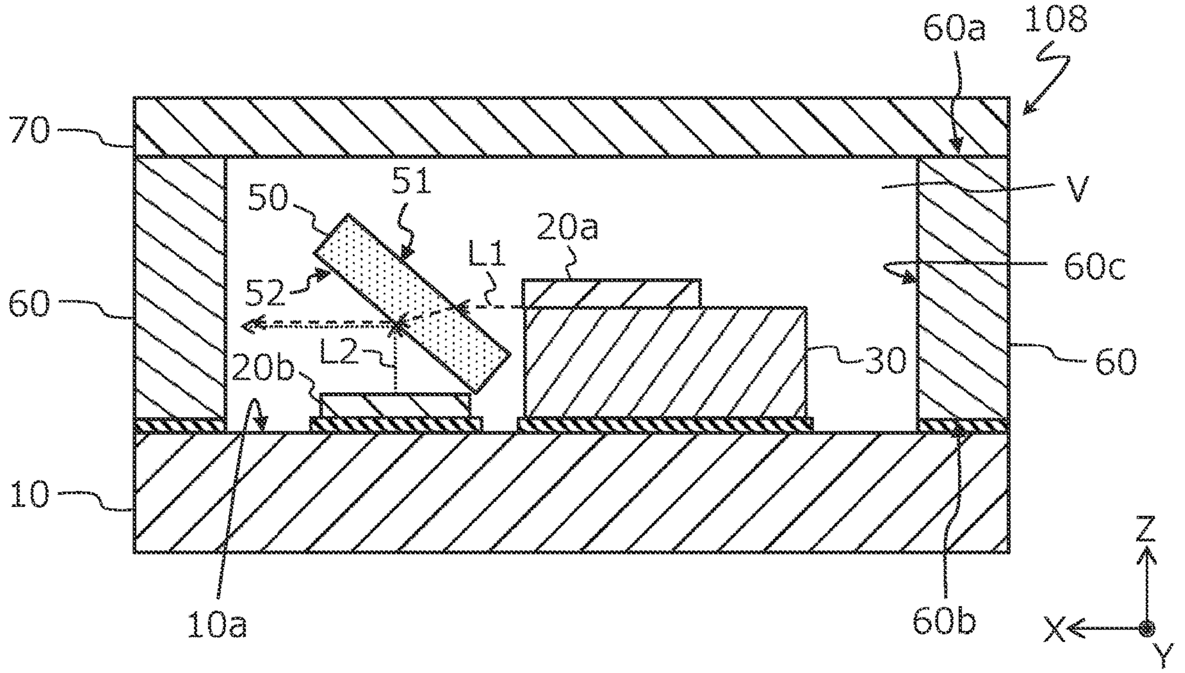
FIG. 11 is a schematic cross-sectional view of a light source device according to a ninth embodiment taken along a plane parallel to the XZ-plane.

FIG. 11 is a schematic cross-sectional view of a light source device 108 according to a ninth embodiment taken along a plane parallel to the XZ-plane. The light source device 108 illustrated in FIG. 11 has substantially the same structure as the structure of the light source device 100; however, the optical characteristics of the reflectance control film that can be disposed on the optical member 50 are different. In the light source device 108, the optical member 50 causes the first light beam L1 and the second light beam L2 having optical axes not parallel to each other to exit the optical member 50 as light beams traveling along the same axis in the first direction. The light beams aligned to the same axis are emitted from the light source device 108 toward its lateral side through the lateral wall 60 of the cap described above.

In the light source device 108 shown in FIG. 11, the dielectric multilayer film described above is disposed on the second incident surface 52. The second incident surface 52 reflects a part of the incident second light beam L2 in the first direction, that is, in the X direction. The second incident surface 52 is adjusted to have a reflectance of, for example, 80% or more for the second light beam L2. The first light beam L1 passes through an interface present between a gas and a solid when incident on the first incident surface 51 of the optical member 50. The interface corresponds to the first incident surface 51. The first light beam L1 incident on the first incident surface 51 is refracted at the interface, and accordingly, the direction of the optical axis of the first light beam L1 is changed. The first light beam L1 transmitted through the optical member 50 and incident on the second incident surface 52 is refracted at the interface, and the direction of the beam is accordingly changed, so that the beam is emitted from the second incident surface 52 in the first direction. The first incident surface 51 is adjusted to have a transmittance of, for example, 80% or more for the first light beam L1. The second incident surface 52 is adjusted to have a transmittance of, for example, 80% or more for the first light beam L1. In this manner, a part of the first light beam L1 emitted from the second incident surface 52 and a part of the second light beam L2 reflected at the second incident surface 52 exit the optical member 50 in the first direction along the same axis.

The lateral wall 60 in the light source device 108 illustrated in FIG. 11 is disposed at such a position on the supporting surface 10*a* as to cross the light beam emitted from the optical member 50 and transmits the light beam. For example, at least a portion of the lateral wall 60 transmitting the light beam can be formed of a material such as alkali glass, alkali-free glass, sapphire, glass containing a phosphor, and a transparent ceramic material. For example, the portion of the lateral wall 60 not transmitting the light beam can be formed of silicon, glass, a ceramic, or the same material as for the substrate 10 described above. The lateral wall 60 can be integrally formed with the substrate 10. An anti-reflection film can be disposed on a surface configured to receive the light beam and/or a surface configured to emit the light beam of the portion of the lateral wall 60 transmitting the light beam. The lateral wall 60 can have the function as a condensing lens or a collimating lens.

Tenth Embodiment

Figure 12:
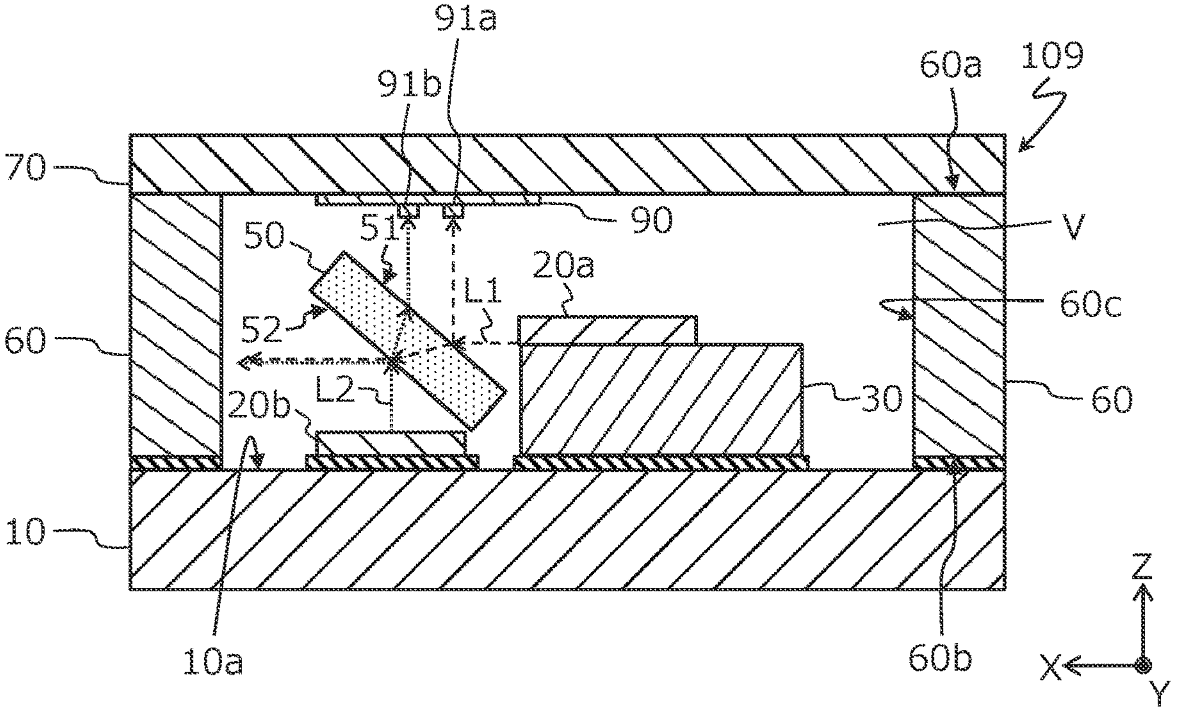
FIG. 12 is a schematic cross-sectional view of a light source device according to a tenth embodiment taken along a plane parallel to the XZ-plane.

FIG. 12 is a schematic cross-sectional view of a light source device 109 according to a tenth embodiment taken along a plane parallel to the XZ-plane. The light source device 109 illustrated in FIG. 12 has a constitution in which a photodetector 90 is disposed in the light source device 108. The other part of the constitution is the same as in the light source device 108. As described with reference to FIG. 11, in the case in which the light beams exit the optical member 50 toward the lateral side of the light source device 109 along the same axis, the photodetector 90 is located on the side opposite to the surface-emitting laser element 20*b* with respect to the optical member 50 in the second direction. For example, the photodetector 90 can be bonded to the lower surface of the cover portion 70 of the cap. The first incident surface 51 reflects a part of the incident first light beam L1 in the second direction toward the light receiving unit 91*a*. Further, the second light beam L2 that has been incident on the second incident surface 52 and transmitted through the optical member 50 exits the first incident surface 51 and travels in the second direction toward the light receiving unit 91*b*.

Eleventh Embodiment

Figure 13:
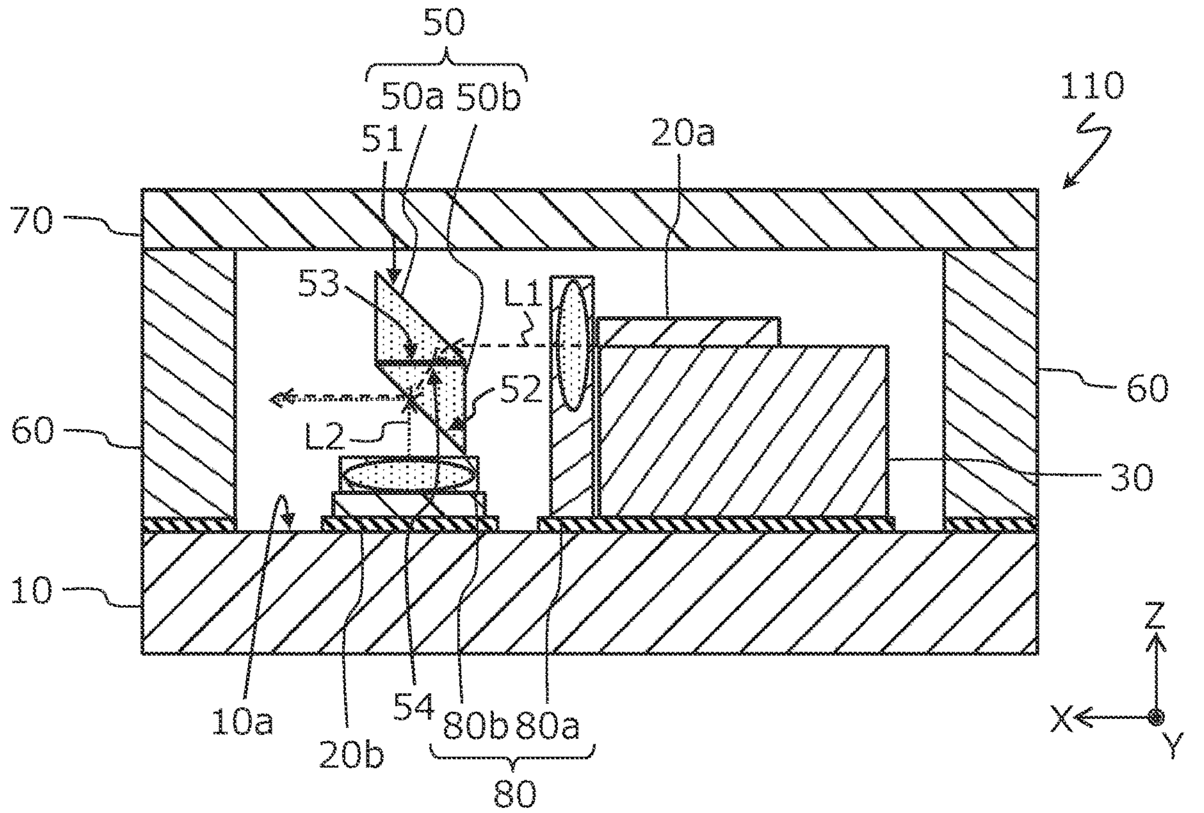
FIG. 13 is a schematic cross-sectional view of a light source device according to an eleventh embodiment taken along a plane parallel to the XZ-plane.

FIG. 13 is a schematic cross-sectional view of a light source device 110 according to an eleventh embodiment taken along a plane parallel to the XZ-plane. The light source device 110 illustrated in FIG. 13 has substantially the same constitution as the constitution of the light source device 105 described above; however, the optical characteristics of the reflectance control film that is disposed on the optical member 50 are different. As illustrated in FIG. 13, adjustment of the optical characteristics of the reflectance control film allows the light beams to be emitted from the optical member 50 toward the lateral side of the light source device 110 using the first and second prism mirrors 50*a* and 50*b*.

In the light source device 110 illustrated in FIG. 13, the second incident surface 52 reflects the second light beam L2 in the first direction. The second incident surface 52 emits in the first direction the first light beam L1 that has been incident on the first incident surface 51 and transmitted through the first prism mirror 50*a* and the second prism mirror 50*b* in this order. The first light beam L1 incident on the first incident surface 51 is refracted at the first incident surface 51, the interface between the first lower surface 53 and the second lower surface 54, and the second incident surface 52. The first light beam L1 emitted from the second incident surface 52 and the second light beam L2 reflected at the second incident surface 52 exit the optical member 50 as light beams traveling in the first direction along the same axis.

With the ninth to eleventh embodiments, a plurality of light beams having optical axes not parallel to each other can be caused to travel along the same axis by the optical member toward the lateral side of the light source device.

Hereinafter, the light source devices according to the embodiments of the present disclosure can be used for medical applications, cosmetic applications, and the like. Light emitted from the edge-emitting laser can be used for a laser scalpel, removal of spots or bruises, or the like, and light emitted from the surface-emitting laser can be used for an alignment beam when a laser scalpel is used, measurement or evaluation of site to be treated, or the like. Lasers having peak wavelengths that fit the purpose can be selected from lasers having peak wavelengths within the range of 350 nm to 1,600 nm and can be used as the edge-emitting laser and the surface-emitting laser. It is preferable that the edge-emitting laser have a peak wavelength within the range of 350 nm to 1,000 nm and that the surface-emitting laser have a peak wavelength within the range of 400 nm to 950 nm or 1,300 nm to 1,600 nm. It is preferable that the peak wavelengths of the edge-emitting laser and the surface-emitting laser be differ from each other by 50 nm or more. This is because separation of light emitted from the edge-emitting laser from light emitted from the surface-emitting laser can be facilitated. As described above, an example of the surface-emitting laser element is a VCSEL element. The light source devices in the present disclosure can also be used for, for example, cutting, drilling, local heat treatment, surface treatment, and welding of a metal for various types of materials.

What is claimed is:

1. A light source device comprising:
a substrate having a supporting surface;
an edge-emitting laser element directly or indirectly supported by the supporting surface and configured to emit a first light beam in a first direction;
a surface-emitting laser element directly or indirectly supported by the supporting surface and configured to emit a second light beam in a second direction different from the first direction; and
an optical member configured to receive the first light beam and the second light beam and to cause the first light beam and the second light beam to exit the optical member as light beams traveling along a same axis.

2. The light source device according to claim 1, wherein
the optical member has a shape of a flat plate and has a first incident surface configured to receive the first light beam and inclined with respect to the supporting surface and a second incident surface configured to receive the second light beam and parallel to the first incident surface.

3. The light source device according to claim 1, wherein
the optical member includes
a first prism mirror having a first incident surface inclined with respect to the supporting surface at a first inclination angle and configured to receive the first light beam and a first lower surface; and
a second prism mirror having a second incident surface inclined with respect to the supporting surface at a second inclination angle and configured to receive the second light beam and a second lower surface facing the first lower surface.

4. The light source device according to claim 1, further comprising
a pedestal having an inclined surface inclined with respect to the supporting surface at a first inclination angle and bonded to the supporting surface,
the surface-emitting laser element is bonded to the inclined surface, and
the optical member includes a prism mirror having
a first incident surface inclined with respect to the supporting surface at a second inclination angle and configured to receive the first light beam, and
a second incident surface parallel to the supporting surface and configured to receive the second light beam.

5. The light source device according to claim 1, further comprising
a light controlling element configured to change inclination of an optical axis of the second light beam with respect to a normal direction of the supporting surface, wherein
the optical member includes a prism mirror having
a first incident surface configured to receive the first light beam and inclined with respect to the supporting surface, and
a second incident surface configured to receive the second light beam and parallel to the supporting surface, and
the light controlling element is disposed on a light exit surface of the surface-emitting laser element or the second incident surface of the prism mirror.

6. The light source device according to claim 1, further comprising a cap supported by the supporting surface and covering the surface-emitting laser element, the edge-emitting laser element, and the optical member.

7. The light source device according to claim 1, further comprising a first submount bonded to the supporting surface, and disposed between the edge-emitting laser element and the supporting surface so that the edge-emitting laser element is supported by the supporting surface via the first submount, wherein the surface-emitting laser element is directly supported by the supporting surface.

8. The light source device according to claim 1, further comprising a first submount bonded to the supporting surface and disposed between the edge-emitting laser element and the supporting surface so that the edge-emitting laser element is supported by the supporting surface via the first submount, and a second submount bonded to the supporting surface and disposed between the surface-emitting laser element and the supporting surface so that the surface-emitting laser element is supported by the supporting surface via the second submount.

9. The light source device according to claim 1, further comprising a lens unit disposed at least one of between the edge-emitting laser element and the optical member and on an optical path of the first light beam, and between the surface-emitting laser element and the optical member and on an optical path of the second light beam.

10. The light source device according to claim 1, further comprising a photodetector configured to monitor an intensity of each of the first light beam and the second light beam.

11. The light source device according to claim 1, wherein an output of the edge-emitting laser element is within a range of 0.01 W to 50 W, and an output of the surface-emitting laser element is within a range of 0.01 mW to 10 mW.

12. The light source device according to claim 1, wherein a wavelength of the first light beam is within a range of 350 nm to 1,000 nm, and a wavelength of the second light beam is within a range of 400 nm to 950 nm or within a range of 1,300 nm to 1,600 nm.

13. The light source device according to claim 6, wherein the cap includes a lateral wall bonded to the substrate, and a cover portion bonded to the lateral wall, the lateral wall, the cover portion, and the substrate define a sealed space, and the edge-emitting laser element, the surface-emitting laser element, and the optical member are disposed inside the sealed space.

* * * * *